(12) United States Patent
Forsythe et al.

(10) Patent No.: US 8,648,334 B2
(45) Date of Patent: Feb. 11, 2014

(54) ORGANIC LIGHT EMISSIVE DEVICE COMPRISING A TRILAYER CATHODE

(75) Inventors: Daniel Alan Forsythe, Cambridge (GB); Simon King, Cambridge (GB); Matthew Roberts, Cambridge (GB)

(73) Assignees: Cambridge Display Technology Limited, Cambridgeshire (GB); Sumitomo Chemical Co., Ltd., Tokyo (JP)

( * ) Notice: Subject to any disclaimer, the term of this patent is extended or adjusted under 35 U.S.C. 154(b) by 118 days.

(21) Appl. No.: 12/991,381

(22) PCT Filed: Mar. 31, 2009

(86) PCT No.: PCT/GB2009/000858
§ 371 (c)(1),
(2), (4) Date: Nov. 8, 2010

(87) PCT Pub. No.: WO2009/136133
PCT Pub. Date: Nov. 12, 2009

(65) Prior Publication Data
US 2011/0057229 A1    Mar. 10, 2011

(30) Foreign Application Priority Data
May 9, 2008    (GB) .................................. 0808455.0

(51) Int. Cl.
*H01L 29/08*    (2006.01)

(52) U.S. Cl.
USPC .......... 257/40; 257/E51.018; 257/98; 257/99; 257/79

(58) Field of Classification Search
USPC ................. 257/80, 13, 79, 40, 90, 93; 438/99
See application file for complete search history.

(56) References Cited

U.S. PATENT DOCUMENTS

| | | |
|---|---|---|
| 4,539,507 A | 9/1985 | VanSlyke et al. |
| 5,150,006 A | 9/1992 | Van Slyke et al. |
| 5,432,014 A | 7/1995 | Sano et al. |
| 5,621,131 A | 4/1997 | Kreuder et al. |
| 5,723,873 A | 3/1998 | Yang |

(Continued)

FOREIGN PATENT DOCUMENTS

| | | |
|---|---|---|
| EP | 0 707 020 A2 | 4/1996 |
| EP | 0842208 A1 | 5/1998 |

(Continued)

OTHER PUBLICATIONS

International Search Report and Written Opinion for PCT/GB2009/000858 dated Jun. 4, 2009.

(Continued)

*Primary Examiner* — Bilkis Jahan
(74) *Attorney, Agent, or Firm* — Marshall, Gerstein & Borun LLP (57) ABSTRACT

A method of manufacturing an organic light emissive device comprising: depositing an organic light emissive layer over an anode and depositing a cathode over the organic light emissive layer, wherein the cathode comprises a trilayer structure formed by: depositing a first layer comprising an electron injecting material; depositing a second layer over the first layer, the second layer comprising a metallic material having a workfunction greater than 3.5 eV; and depositing a third layer over the second layer, the third layer comprising a metallic material having a workfunction greater than 3.5 eV.

11 Claims, 3 Drawing Sheets

(56) References Cited

U.S. PATENT DOCUMENTS

| | | | |
|---|---|---|---|
| 5,798,170 | A | 8/1998 | Zhang et al. |
| 6,083,634 | A | 7/2000 | Shi |
| 6,255,774 | B1 | 7/2001 | Pichler |
| 6,268,695 | B1 | 7/2001 | Affinito |
| 6,353,083 | B1 | 3/2002 | Inbasekaran et al. |
| 6,563,262 | B1 | 5/2003 | Cao |
| 6,576,093 | B1 | 6/2003 | Burroughes et al. |
| 6,849,869 | B1 * | 2/2005 | O'Regan et al. ............. 257/40 |
| 6,953,628 | B2 | 10/2005 | Kamatani et al. |
| 7,083,863 | B2 * | 8/2006 | Satou et al. .................. 428/690 |
| 7,125,998 | B2 | 10/2006 | Stossel et al. |
| 7,238,435 | B2 | 7/2007 | Kamatani et al. |
| 7,270,894 | B2 * | 9/2007 | Liu et al. ...................... 428/690 |
| 7,544,426 | B2 | 6/2009 | Kamatani et al. |
| 2002/0117662 | A1 | 8/2002 | Nii |
| 2002/0182441 | A1 | 12/2002 | Lamansky et al. |
| 2003/0091862 | A1 | 5/2003 | Tokito et al. |
| 2004/0075382 | A1 | 4/2004 | Stegamat et al. |
| 2004/0115474 | A1 * | 6/2004 | Albrecht et al. ............ 428/690 |
| 2004/0147555 | A1 | 7/2004 | Fujimoto et al. |
| 2004/0245918 | A1 * | 12/2004 | Lee ............................. 313/503 |
| 2005/0088080 | A1 * | 4/2005 | Cheng et al. ................. 313/504 |
| 2005/0189883 | A1 * | 9/2005 | Suh et al. .................. 315/169.3 |
| 2007/0157071 | A1 | 7/2007 | Daniell ...................... 715/500.1 |
| 2007/0222370 | A1 * | 9/2007 | Zhu et al. .................... 313/504 |

FOREIGN PATENT DOCUMENTS

| | | | |
|---|---|---|---|
| EP | 0880303 | A1 | 11/1998 |
| EP | 0 901 176 | A2 | 3/1999 |
| EP | 0 947 123 | A1 | 10/1999 |
| EP | 0949850 | A1 | 10/1999 |
| EP | 1076368 | A2 | 2/2001 |
| EP | 1 245 659 | A1 | 10/2002 |
| JP | 2002-324679 | A | 11/2002 |
| WO | WO-9810621 | A1 | 3/1998 |
| WO | WO-98/57381 | A1 | 12/1998 |
| WO | WO-99/48160 | A1 | 9/1999 |
| WO | WO-0048258 | A1 | 8/2000 |
| WO | WO-0053656 | A1 | 9/2000 |
| WO | WO-0055927 | A1 | 9/2000 |
| WO | WO-0106576 | A1 | 1/2001 |
| WO | WO-0119142 | A1 | 3/2001 |
| WO | WO-0162869 | A1 | 8/2001 |
| WO | WO-0181649 | A1 | 11/2001 |
| WO | WO-0231896 | A2 | 4/2002 |
| WO | WO-0244189 | A1 | 6/2002 |
| WO | WO-0245466 | A1 | 6/2002 |
| WO | WO-02/066552 | A1 | 8/2002 |
| WO | WO-02/068435 | A1 | 9/2002 |
| WO | WO-02/081448 | A1 | 10/2002 |
| WO | WO-02/084759 | A1 | 10/2002 |
| WO | WO-03/019696 | A2 | 3/2003 |
| WO | WO-03/022908 | A1 | 3/2003 |
| WO | WO-03018653 | A1 | 3/2003 |
| WO | WO-2006016153 | A1 | 2/2006 |

OTHER PUBLICATIONS

Great Britian Search Report for GB0808455.0 dated Aug. 26, 2008.
Bernius et al., "Progress with Light-Emitting Polymers," *Adv. Matter*, 12:1737-1750 (2000).
Chen et al., "Triplet exciton confinement in phosphorescent polymer light-emitting diodes," *Applied Physics letters*, 82:1006-1008 (2003).
Cleave et al., "Harvesting Singlet and Triplet Energy in Polymer LED's," *Advanced Materials*, 11:285-288 (1999).
Hung et al., "Enhanced electron injection in organic elec oluminescence devices using an Al/LiF electrode," *Appl. Phys. Lett.*, 70:152-154 (1997).
Ikai et al., "Highly efficient phosphorescence from organic light-emitting devices with an exciton-block layer," *Appl. Phys. Lett.*, 79:156-158 (2001).
Lane et al., "Origin of electrophosphorescence from a doped polymer light emitting diode," *Physical Review B*, 63:235206-1/235206-8 (2001).
Lee et al., "Polymer phosphorescent light-emitting devices doped with ris(2-phenylpyridine) iridium as a triplet emitter," *Appl. Phys. Lett.*, 77:2280-2282 (2000).
Niu et al., "Thermal annealing below the glass transition temperature: A general way to increase performance of light-emitting diodes based on copolyfluorenes," *Applied Physics letters*, 81:634-636 (2002).
O'Brien et al., "Electrophosphoresence from a doped polymer light emitting diode," *Synthetic Metals*, 116:379-383 (2001).
Setayesh et al., "Bridging the Gap between Polyfluorene and Ladder-Poly-p-phenylene: Synthesis and Characterization of Poly-2,8-indenofluorene," *Macromolecules*, 33:2016-2020 (2000).
Tokito et al., "Metal oxides as a hole-injecting layer for an organic electroluminescent device," *J. Phys. D: Appl. Phys*, 29:2750-2753 (1996).
Yamaguchi et al., "Effects of B and C on the ordering of $L1_0$-CoPt thin films," *Applied Physics Letters*, 79:2001-2003 (2001).
Yamamoto, "Electrically Conducting and Thermally Stable π-Conjugated Poly (arylene)s Prepared by Organometallic Processes," *Prog. Polym. Sci.*, 17:1153-1205 (1992).
Yang et al., "Efficient polymer light emitting diodes with metal fluoride/Al cathodes," *Appl. Phys.*, 79:563-565 (2001).
Zhu et al. "Synthesis of new iridium complexes and their electrophosphorescent properties in polymer light-emitting diodes," J. Mater. Chem., 13:50-55 (2003).
International Preliminary Report on Patentability for PCT/GB2009/000858, dated Nov. 9, 2010.
Hung et al., "Application of an Ultrathin LiF/Al Bilayer in Organic Surface-Emitting Diodes," *Applied Physics Letters*, 78:544-546 (2001).

* cited by examiner

ORGANIC LIGHT EMISSIVE DEVICE COMPRISING A TRILAYER CATHODE

FIELD OF THE INVENTION

The present invention relates to organic light emissive devices and new cathode structures for use therein.

BACKGROUND OF THE INVENTION

Organic light emissive devices (OLEDs) generally comprise a cathode, an anode and an organic light emissive region between the cathode and the anode. Light emissive organic materials may comprise small molecular materials such as described in U.S. Pat. No. 4,539,507 or polymeric materials such as those described in PCT/WO90/13148. The cathode injects electrons into the light emissive region and the anode injects holes. The electrons and holes combine to generate photons at a recombination zone in the light-emissive region.

Figure 1:
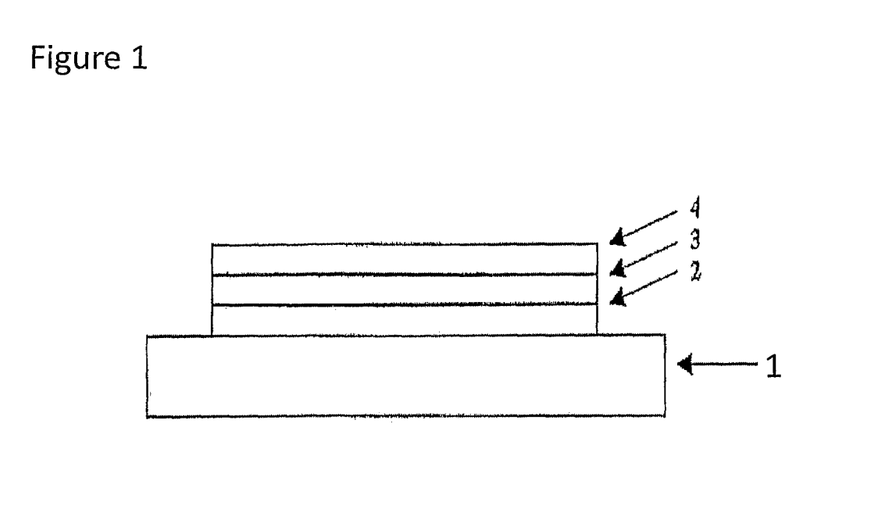
FIG. 1 shows in diagrammatic form a typical cross-sectional structure of an OLED.

FIG. 1 shows a typical cross-sectional structure of an OLED. The OLED is typically fabricated on a glass or plastics substrate 1 coated with a transparent anode 2 such as an indium-tin-oxide (ITO) layer. The ITO coated substrate is covered with at least a layer of a thin film of an electroluminescent organic material 3 and cathode material 4. Other layers may be added to the device, for example to improve charge transport between the electrodes and the electroluminescent material.

In one arrangement shown in FIG. 1, the substrate 1 and the anode 2 are transparent to allow light emitted by the electroluminescent organic layer 3 to pass therethrough. Such an arrangement is known as a bottom-emitting device. In another arrangement the cathode 4 is transparent so as to allow light emitted from the electroluminescent organic layer 3 to pass therethrough. Such an arrangement is known as a top-emitting device.

There has been a growing interest in the use of OLEDs in display applications because of their potential advantages over conventional displays. OLEDs have relatively low operating voltage and power consumption and can be easily processed to produce large area displays. On a practical level, there is a need to produce OLEDs which are bright and operate efficiently but which are also reliable to produce and stable in use.

The structure of the cathode in OLEDs is one aspect under consideration in this art. In the case of a monochrome OLED, the cathode may be selected for optimal performance with a single electroluminescent organic material. However, a full color OLED comprises red, green and blue light organic emissive materials. Such a device requires a cathode capable of injecting electrons into all three emissive materials, i.e. a "common electrode".

Cathode 4 may be selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer (1 to 15 nm) of dielectric material to assist electron injection, for example lithium fluoride disclosed in WO 00/48258 or barium fluoride, disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

A layer of metal fluoride located between the organic emissive layer (or organic electron transporting layer, if present) and the metal cathode can result in an improvement in device efficiency—see for example Appl. Phys. Lett. 70, 152, 1997. This improvement is believed to result from a reduction in the barrier height at the polymer/cathode interface, allowing improved electron injection into the organic layer(s). A mechanism of device degradation using the LiF/Al cathode is proposed in Appl. Phys. Lett. 79(5), 563-565, 2001 wherein LiF and Al may react to release Li atoms that can migrate into the electroluminescent layer and dope the electroluminescent material. However, the present inventors have found the LiF/Al cathode to be relatively stable, its main drawback being relatively low efficiency (in particular when used as a common cathode). A more efficient arrangement utilizes a tri-layer of LiF/Ca/Al, which is described as a common cathode in Synth. Metals 2000, 111-112, p. 125-128. However, it is reported in WO 03/019696 that degradation is particularly marked for devices comprising this cathode and fluorescent electroluminescent materials comprising sulfur such as the red emitting polymer comprising the turner repeat unit thiophene-benzothiadiazole-thiophene. WO 03/019696 proposes using a barium based material rather than LiF and discloses a tri-layer structure of $BaF_2$/Ca/Al for these fluorescent electroluminescent materials comprising sulfur. The use of other barium compounds including barium halides and barium oxide is also mentioned as a possibility in WO 03/019696. The barium compound layer is disclosed as having a thickness in the range 1 to 6 nm.

U.S. Pat. No. 6,563,262 proposes using a bilayer of a metal oxide (e.g. BaO) with aluminium for fluorescent poly(p-phenylene vinylene) emissive materials (PPVs). The metal oxide layer is disclosed as having a thickness in the range 1.5 to 20 nm.

In light of the above, it can be seen that there are various disclosures of using thin metal compound layers as electron-injecting layers in a cathode of an organic light emissive device. Thus, these layers do not provide good protection of the underlying layers when, for example, an overlying layer is deposited using a high-energy process such as sputtering.

WO 2006/016153 discloses the use of a composite electron-injecting layer comprising a metal compound and a metal. It is taught that such composite layers can reduce quenching by the metal component while retaining good electrical properties. It is further taught that these composite layers can be made with good transparency for top-emitting devices. It is further taught that the metal component increases the conductivity of the layer thus allowing thick, transparent, conductive layers to be provided which can act as a buffer layer (sputter barrier) for protecting underlying layers when a material such as ITO is sputtered thereover. However, a possible problem with these composite layers is that the co-deposition process used to form them is more expensive and difficult to control when compared with deposition of single components.

U.S. Pat. No. 6,576,093 discloses a bilayer cathode comprising a layer of a low workfunction material such as Ca and a layer of a higher workfunction material such as aluminium. It is described that a cathode layer is typically deposited by vacuum evaporation or by a sputtering technique such as rf sputtering or dc magnetron sputtering. It is described that when the underlying layer is a layer of a relatively sensitive material such as a soluble conjugated polymer, vacuum evaporation is often the preferred technique for depositing the first layer because it is a relatively low-energy process which causes less damage to the underlying layer of organic material. It is further described that cathode layers deposited by conventional vacuum evaporation techniques contain pinholes through which water and oxygen are able to enter the device and initiate reactions at the interface between the organic layer and the cathode. These reactions result in the formation of non-emitting black spots with a consequential degradation in device performance. Accordingly, it is suggested that the cathode should be formed by depositing a first layer of a low workfunction material using a low energy deposition technique such as vacuum evaporation and depositing a second layer of a higher workfunction material by a conformable deposition technique such as a sputtering technique.

An aim of embodiments of the present invention is to provide an alternative solution to the aforementioned problem of pinholes in the cathode layers leading to non-uniform light emission. A further aim is to provide an organic light emissive device structure which has increased opto-electrical efficiency. Yet a further aim is to provide an organic light emissive device structure which has a lower initial drive voltage and better drive voltage stability during storage and baking. A yet further aim is to provide an organic light emissive device with improved lifetime, in particular at elevated operating temperature.

SUMMARY OF THE INVENTION

According to a first aspect of the present invention there is provided a method of manufacturing an organic light emissive device comprising: depositing an organic light emissive layer over an anode and depositing a cathode over the organic light emissive layer, wherein the cathode comprises a trilayer structure formed by: depositing a first layer comprising an electron injecting material; depositing a second layer over the first layer, the second layer comprising a metallic material having a workfunction greater than 3.5 eV; and depositing a third layer over the second layer, the third layer comprising a metallic material having a workfunction greater than 3.5 eV.

It has been surprisingly found that the provision of a third layer of high work function metallic material over a bilayer comprising a low workfunction electron injecting layer and a high workfunction metallic layer increases opto-electrical efficiency, reduces initial drive voltage, improves lifetime (in particular at elevated temperature), and results in better drive voltage stability during storage and baking. Furthermore, the problem of non-uniform light emission caused by pin holes is solved even if low energy deposition techniques such as vacuum evaporation are used for the cathode layers.

Previous multi-layer cathode structures consisted either of a bilayer comprising a low workfunction electron injecting layer and a high workfunction capping layer or alternatively a trilayer structure comprising two low workfunction layers with a high workfunction capping layer thereover (such as Li/Ca/Al) or a trilayer structure comprising a metal compound layer, a low workfunction layer and a high workfunction capping layer (such as LiF/Ca/Al). It was considered that in such a trilayer structure the first two layers could interact to improve electron injection.

The increase in opto-electrical efficiency and reduction in drive voltage achieved by the present cathode structure may be considered surprising as, on the face of it, the addition of a further high workfunction metallic layer (over a bilayer comprising a low workfunction electron injecting layer and a high workfunction metallic layer) would not be expected to significantly change the electron injecting properties of the cathode structure. The fact that the third layer is significantly spaced apart from the electron injecting interface and that it has a high workfunction may suggest that it would have little effect on the efficiency and drive voltage of the device. However, the present applicant has found that this is not the case and that surprisingly the provision of such a third layer increases opto-electrical efficiency, reduces initial drive voltage, and results in better drive voltage stability during storage and baking when compared to a bilayer cathode structure without the third layer.

Furthermore, the problem of non-uniform light emission caused by pin holes is solved without requiring the use of a high energy conformable deposition technique such as a sputtering technique as described in U.S. Pat. No. 6,576,093. Accordingly, at least the first and second layers, and even the third layer, may be deposited using a low energy deposition technique such as vacuum evaporation. It is postulated that the third layer fills in pinholes present in the second layer, such that the second and third layers together form a smooth and relatively pinhole-free structure that is much more resistant to ingress of water and oxygen than the second layer alone.

Electrical connection for the cathode may be made directly to the third layer. Alternatively, electrical connection may be made directly to the second layer. In any event, it will be appreciated that both the second and third layers are at least indirectly electrically connected to the power source used to drive the device.

Preferably the second and third layers are simple metals or alloys without any substantial amount of low workfunction material disposed therein. As has been previously described, the advantageous functional effects such as a reduction in drive voltage and an increase in efficiency are surprising achieved using high workfunction materials for the second and third layers without requiring further low workfunction materials. As such, co-deposition processes used to form such composite layers (which are more expensive and difficult to control) can be avoided.

Preferably, the second and third layers are formed in a vacuum chamber without any break in vacuum between deposition of the second and third layers. In this way, the second and third layers may provide the device with a "primary" encapsulation that protects the device from any exposure to moisture or oxygen that may occur before the device is provided with further encapsulating layers.

An encapsulation coating comprising one or more polymer layers and/or one or more dielectric layers may be deposited over the third layer. Preferably, the encapsulation coating comprises alternating polymer and dielectric layers. Alternatively, the device may be encapsulated using an enclosure such as a glass or metal "can" that is applied over the device and adhered to the substrate in order to enclose the device.

The workfunction of the material of the first layer may be less than 3.5 eV, less than 3.3 eV, or more preferably less than 3.1 eV. The workfunction of the material of the second and/or third layer may be greater than 3.7 eV, more preferably greater than 3.9 eV.

The material of the first layer may be selected from a group I or II metal, an alloy of a group I or II metal, and a compound of a group I or II metal, e.g. an oxide or a fluoride. Examples of suitable materials include Ba, BaO and NaF.

Preferably, the first layer has a thickness of up to 10 nm, more preferably up to 5 nm.

Preferably, the second and third layers each independently have a thickness in the range of 20-500 nm. The second layer more preferably has a thickness in the range of 100-300 nm, and the third layer more preferably has a thickness in the range of 50-200 nm.

Examples of suitable materials for the second and/or third layer are Al, Ag and NiCr. The material of the third layer is preferably different to that of the second layer. In one preferred embodiment the second layer is aluminium and the third layer is Ag or NiCr. However, it is possible that the third layer may be made of the same material as the second layer but deposited in a separate and distinct deposition step from the second layer such that a distinct interface is provided between the second and third layers. In this case, the presence of two distinct layers with an interface therebetween may be determined be analysing the microstructure of the second and third layers.

According to a second aspect of the present invention there is provided an organic light emissive device comprising: an anode; a cathode; and an organic light emissive layer between the anode and the cathode, wherein the cathode comprises a trilayer structure comprising: a first layer comprising a material having a workfunction of 3.5 eV or less; a second layer disposed over the first layer and comprising a material having a workfunction greater than 3.5 eV; and a third layer disposed over the second layer and also comprising a material having a workfunction greater than 3.5 eV. The organic light emissive device may be manufactured and have one or more of the features as described in relation to the first aspect of the invention.

According to a third aspect of the present invention there is provided an organic light emissive device comprising: an anode; a cathode; and an organic light emissive layer between the anode and the cathode, wherein the cathode comprises a bilayer structure comprising: a first layer consisting of material having a workfunction greater than 3.5 eV; and a second layer disposed over the first layer and also consisting of material having a workfunction greater than 3.5 eV.

According to a fourth aspect of the present invention there is provided a method of manufacturing an organic light emissive device comprising: depositing an organic light emissive layer over an anode and depositing a cathode over the organic light emissive layer, wherein the cathode comprises a bilayer structure formed by: depositing a first layer comprising a metallic material having a workfunction greater than 3.5 eV; and depositing a second layer over the first layer, the second layer also comprising a metallic material having a workfunction greater than 3.5 eV, wherein the first layer and the second layer are deposited by vacuum evaporation.

The third and fourth aspects may have one or more of the features as described in relation to the first and second aspects but do not require the provision of a separate electron injecting layer. These aspects may be useful in devices which do not necessarily require optimized electron injection.

BRIEF DESCRIPTION OF THE DRAWINGS

The present invention will now be described in further detail, by way of example only, with reference to the accompanying drawings in which:

FIGS. 3(*a*) and 3(*b*) show device electroluminescence after baking/storage for devices having a standard cathode structure;

FIGS. 4(*a*) and 4(*b*) show device electroluminescence after storage/baking for devices having a cathode structure in accordance with embodiments of the present invention;

DETAILED DESCRIPTION OF PREFERRED EMBODIMENTS

Figure 2:
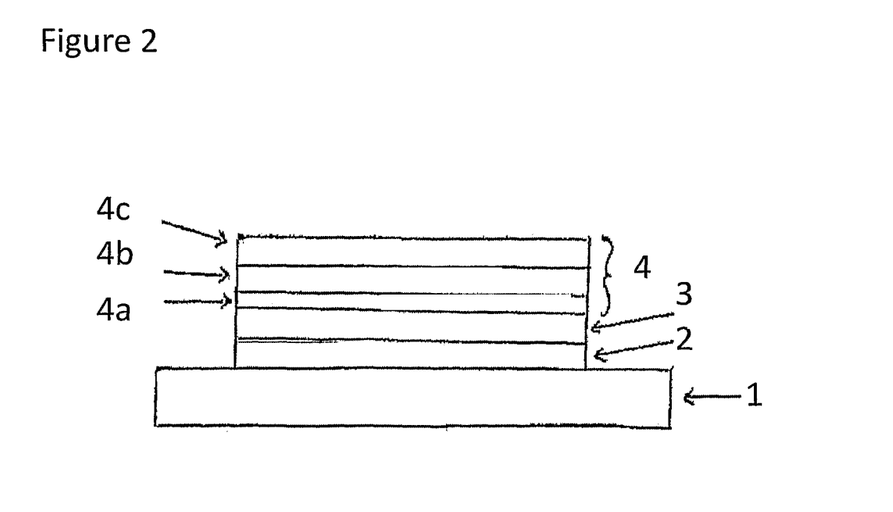
FIG. 2 shows a cross-sectional structure of an OLED according to an embodiment of the present invention.

FIG. 1 has been previously described and shows in diagrammatic form a typical cross-sectional structure of an OLED. FIG. 2 shows a cross-sectional structure of an OLED according to an embodiment of the present invention. Like reference numerals have been used for like parts in order to more clearly show the structure of the embodiment in comparison to the standard structure shown in FIG. 1. The OLED comprises a substrate 1, an anode 2, an organic light emitting layer 3, and a cathode 4. In accordance with the present invention the cathode 4 comprises: a first layer 4*a* comprising an electron injecting material; a second layer 4*b* disposed over the first layer and comprising a material having a workfunction greater than 3.5 eV; and a third layer 4*c* disposed over the second layer and also comprising a material having a workfunction greater than 3.5 eV.

Figure 3:
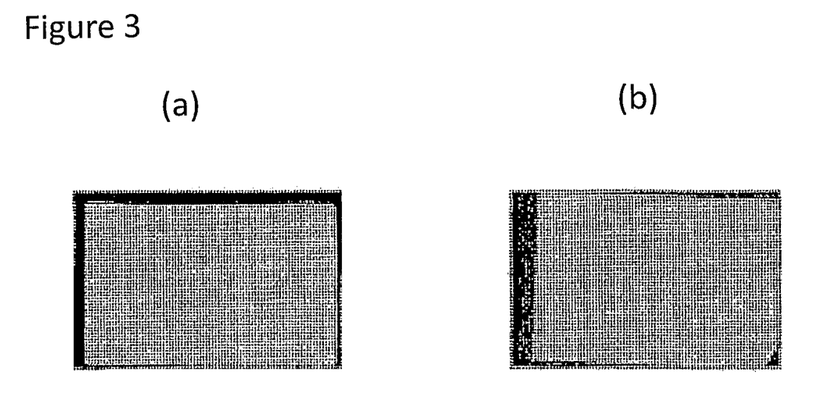

Standard devices have been found to develop bright spots or a mottled appearance during storage or baking. For example, FIG. 3(*a*) shows the electroluminescence after baking/storage for a device having a NaF/Al bilayer cathode and FIG. 3(*b*) shows the electroluminescence after baking/storage for a device having a BaO/Al bilayer cathode. As can be seen, both devices have a mottled appearance with un-even light emission.

Figure 4:
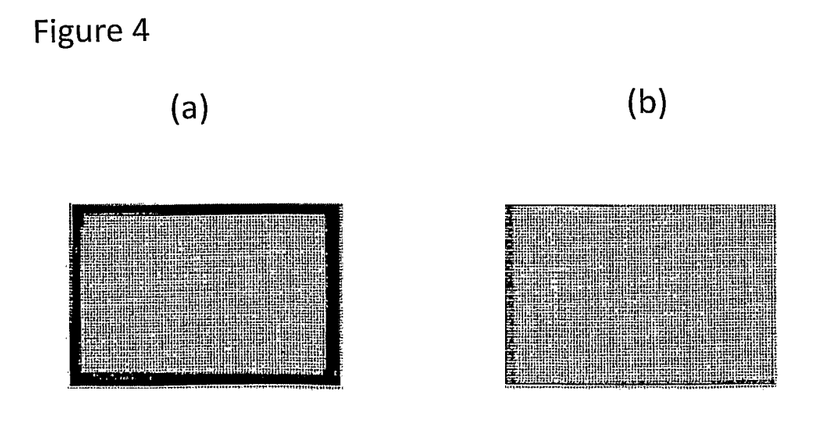

It has been found that an additional capping layer of a high workfunction metal improves the appearance of the device emission after storage and/or baking. For example, FIG. 4(*a*) shows the electroluminescence after baking/storage for a device having a NaF/Al/Ag trilayer cathode and FIG. 4(*b*) shows the electroluminescence after baking/storage for a device having a BaO/Al/Ag trilayer cathode. As can be seen, both devices have an even light emission.

Figure 5:
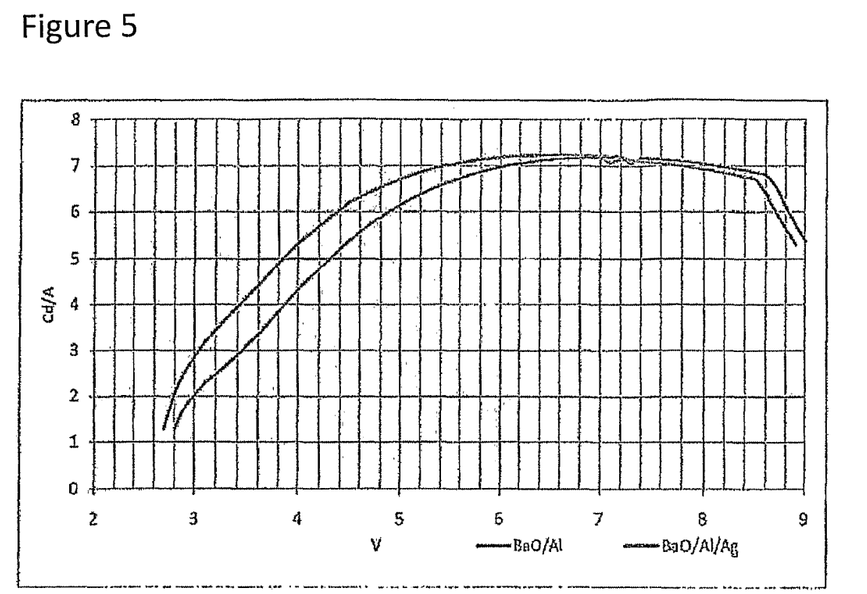
FIG. 5 shows the efficiency curve for a device having a cathode structure in accordance with an embodiment of the present invention (top line) compared with a device having a standard cathode structure (bottom line)

In addition, it has been found that an additional capping layer of a high workfunction metal improves electron injection at the cathode. This is shown by the improved efficiency at low drive voltage. An example is illustrated in FIG. 5 which shows the efficiency curve for a device having a cathode structure BaO/Al/Ag (top line) compared with a device having a cathode structure BaO/Al (bottom line). As can be seen, the Ag capped devices show higher efficiency at low drive voltage compared to the standard BaO/Al cathode structure.

Figure 6:
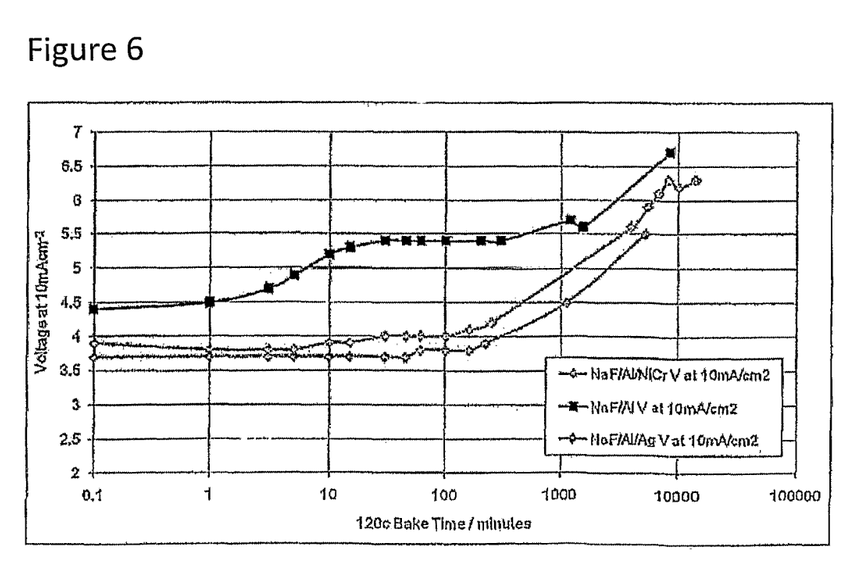
FIG. 6 shows that the initial drive voltage of two devices having cathode structures in accordance with embodiments of the present invention (the two bottom line) compared with a device having a standard cathode structure (top line).

Further still, it has been found that an additional capping layer of a high workfunction metal leads to a significant improvement in both the initial conductivity and the stability of the device conductivity and drive voltage during storage and baking. Examples are illustrated in FIG. 6 which shows that the initial drive voltage of two devices having cathode structures in accordance with embodiments of the present invention (the two bottom line) compared with a device having a standard cathode structure (top line). The device of the bottom line has a cathode structure NaF/Al/Ag. The device of the second bottom line has a cathode structure NaF/Al/NiCr. In contrast, the device of the top line in the graph of FIG. 6 has a cathode structure NaF/Al. As can be seen, the initial drive voltage of the capped NaF devices is lower than the uncapped device and the stability of the device conductivity during baking is improved by the capping.

Other features of embodiments of the present invention are described below with reference to FIG. 2.

Charge Transport Layers

Further layers may be located between anode 2 and cathode 3, such as charge transporting, charge injecting or charge blocking layers.

In particular, it is desirable to provide a conductive hole injection layer, which may be formed from a conductive organic or inorganic material provided between the anode 2 and the electroluminescent layer 3 to assist hole injection from the anode into the layer or layers of semiconducting polymer. Examples of doped organic hole injection materials include doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and poly(thienothiophene). Examples of conductive inorganic materials include transition metal oxides such as VOx MoOx and RuOx as disclosed in Journal of Physics D: Applied Physics (1996), 29(11), 2750-2753.

If present, a hole transporting layer located between anode 2 and electroluminescent layer 3 preferably has a HOMO level of less than or equal to 5.5 eV, more preferably around 4.8-5.5 eV. HOMO levels may be measured by cyclic voltammetry, for example.

If present, an electron transporting layer located between electroluminescent layer 3 and cathode 4 preferably has a LUMO level of around 3-3.5 eV.

Electroluminescent Layer

Electroluminescent layer 3 may consist of the electroluminescent material alone or may comprise the electroluminescent material in combination with one or more further materials. In particular, the electroluminescent material may be blended with hole and/or electron transporting materials as disclosed in, for example, WO 99/48160, or may comprise a luminescent dopant in a semiconducting host matrix. Alternatively, the electroluminescent material may be covalently bound to a charge transporting material and/or host material.

Electroluminescent layer 3 may be patterned or unpatterned. A device comprising an unpatterned layer may be used an illumination source, for example. A white light emitting device is particularly suitable for this purpose. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

Suitable materials for use in layer 3 include small molecule, polymeric and dendrimeric materials, and compositions thereof. Suitable electroluminescent polymers for use in layer 3 include poly(arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein. Suitable electroluminescent dendrimers for use in layer 3 include electroluminescent metal complexes bearing dendrimeric groups as disclosed in, for example, WO 02/066552.

Cathode

Cathode 4 comprises a trilayer structure in accordance with embodiments of the present invention. The cathode may be opaque or transparent. Transparent cathodes are particularly advantageous for active matrix devices because emission through a transparent anode in such devices is at least partially blocked by drive circuitry located underneath the emissive pixels. If the cathode is transparent, preferably the third layer of the cathode is made of a material which is more transparent than the material of the second layer of the cathode. For example, the second layer may be Al and the third layer may be Ag.

Encapsulation

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

Conjugated Polymers (Fluorescent and/or Charge Transporting)

Suitable electroluminescent and/or charge transporting polymers include poly(arylene vinylenes) such as poly(p-phenylene vinylenes) and polyarylenes.

Polymers preferably comprise a first repeat unit selected from arylene repeat units as disclosed in, for example, Adv. Mater. 2000 12(23) 1737-1750 and references therein. Examplary first repeat units include: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably repeat units of formula I:

(I)

wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

Polymers may provide one or more of the functions of hole transport, electron transport and emission depending on which layer of the device it is used in and the nature of co-repeat units. In particular:

- a homopolymer of fluorene repeat units, such as a homopolymer of 9,9-dialkylfluoren-2,7-diyl, may be utilized to provide electron transport.
- a copolymer comprising triarylamine repeat unit, in particular a repeat unit II:

(II)

wherein $Ar^1$ and $Ar^2$ are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 1 may be substituted. Preferred substituents include alkyl and alkoxy groups. Any of the aryl or heteroaryl groups in the repeat unit of Formula 1 may be linked by a direct bond or a divalent linking atom or group. Preferred divalent linking atoms and groups include O, S; substituted N; and substituted C.

Particularly preferred units satisfying Formula II include units of Formulae 2 to 4:

2

3

4 wherein $Ar^1$ and $Ar^2$ are as defined above; and $Ar^3$ is optionally substituted aryl or heteroaryl. Where present, preferred substituents for $Ar^3$ include alkyl and alkoxy groups.

Particularly preferred hole transporting polymers of this type are copolymers of the first repeat unit and a triarylamine repeat unit.

a copolymer comprising a first repeat unit and heteroarylene repeat unit may be utilized for charge transport or emission. Preferred heteroarylene repeat units are selected from formulae 7-21:

7 wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

8

9

10

11

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality. Alternatively, an electroluminescent polymer may be blended with a hole transporting material and/or an electron transporting material. Polymers comprising one or more of a hole transporting repeat unit, electron transporting repeat unit and emissive repeat unit may provide said units in a polymer main-chain or polymer side-chain.

The different regions within such a polymer may be provided along the polymer backbone, as per U.S. Pat. No. 6,353,083, or as groups pendant from the polymer backbone as per WO 01/62869.

Polymerisation Methods

Preferred methods for preparation of these polymers are Suzuki polymerisation as described in, for example, WO 00/53656 and Yamamoto polymerisation as described in, for example, T. Yamamoto, "Electrically Conducting And Thermally Stable □-Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

Solution Processing

A single polymer or a plurality of polymers may be deposited from solution to form layer 3. Suitable solvents for polyarylenes, in particular polyfluorenes, include mono- or polyalkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full color displays. Inkjet printing of OLEDs is described in, for example, EP 0880303.

Other solution deposition techniques include dip-coating, roll printing and screen printing.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

Emission Colors

By "red electroluminescent material" is meant an organic material that by electroluminescence emits radiation having a wavelength in the range of 600-750 nm, preferably 600-700 nm, more preferably 610-650 nm and most preferably having an emission peak around 650-660 nm.

By "green electroluminescent material" is meant an organic material that by electroluminescence emits radiation having a wavelength in the range of 510-580 nm, preferably 510-570 nm.

By "blue electroluminescent material" is meant an organic material that by electroluminescence emits radiation having a wavelength in the range of 400-500 nm, more preferably 430-500 nm.

Hosts for Phosphorescent Emitters

Numerous hosts are described in the prior art including "small molecule" hosts such as 4,4'-bis(carbazol-9-yl)biphenyl), known as CBP, and (4,4',4"-tris(carbazol-9-yl)triphenylamine), known as TCTA, disclosed in Ikai et al., Appl. Phys. Lett., 79 no. 2, 2001, 156; and triarylamines such as tris-4-(N-3-methylphenyl-N-phenyl)phenylamine, known as MTDATA. Polymers are also known as hosts, in particular homopolymers such as poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinylbenzyloxyethyl, N-methylamino)-N-(2,5-di-tert-butylphenylnapthalimide] in Adv. Mater. 1999, 11(4), 285; and poly (para-phenylenes) in J. Mater. Chem. 2003, 13, 50-55. Copolymers are also known as hosts.

Metal Complexes (Mostly Phosphorescent but Includes Fluorescent at the End)

Preferred metal complexes comprise optionally substituted complexes of formula (V):

$$ML^1_qL^2_rL^3_s \quad (V)$$

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet or higher states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, pallaidum, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission color is determined by the choice of the metal. The sharp emission is generally narrow, resulting in a pure color emission useful for display applications.

The d-block metals are particularly suitable for emission from triplet excited states. These metals form organometallic complexes with carbon or nitrogen donors such as porphyrin or bidentate ligands of formula (VI):

(VI)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

Each of Ar$^4$ and Ar$^5$ may carry one or more substituents. Two or more of these substituents may be linked to form a ring, for example an aromatic ring. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

A light-emitting dendrimer typically comprises a light-emitting core bound to one or more dendrons, wherein each dendron comprises a branching point and two or more dendritic branches. Preferably, the dendron is at least partially conjugated, and at least one of the core and dendritic branches comprises an aryl or heteroaryl group. Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission color is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014]. Suitable ligands for di or trivalent metals include: oxinoids, e. g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission color.

While this invention has been particularly shown and described with reference to preferred embodiments thereof, it will be understood by those skilled in the art that various changes in form and details may be made therein without departing from the scope of the invention as defined by the appended claims.

The invention claimed is:

1. An organic light emissive device comprising:
   a substrate;
   an anode disposed on the substrate;
   a cathode disposed over the anode; and
   an organic light emissive layer between the anode and the cathode,
   wherein the cathode consists of a trilayer structure, the trilayer structure consisting of:
   a first layer comprising NaF;
   a second layer disposed on the first layer and comprising Al, wherein the second layer has a thickness in the range of 20-500 nm; and
   a third layer disposed on the second layer and comprising NiCr, wherein the third layer has a thickness in the range of 20-500 nm.

2. The organic light emissive device according to claim 1, wherein the second and third layers are substantially free of low workfunction material.

3. The organic light emissive device according to claim 1, wherein the third layer has a thickness in the range of 50-200 nm.

4. The organic light emissive device according to claim 1, further comprising one or more charge transporting, charge injecting or charge blocking layers disposed between the anode and the cathode.

5. The organic light emissive device according to claim 4, wherein a conductive hole injection layer is provided between the anode and the electroluminescent layer.

6. The organic light emissive device according to claim 4, wherein a hole transporting layer is provided between the anode and the electroluminescent layer.

7. The organic light emissive device according to claim 4, wherein an electron transporting layer is provided between the electroluminescent layer and the cathode.

8. A method of manufacturing an organic light emissive device according to claim 1 comprising:
   depositing the organic light emissive layer over the anode; and
   depositing the cathode over the organic light emissive layer,
   wherein the cathode consists of a trilayer structure formed by:
   depositing a first layer comprising NaF;
   depositing a second layer on the first layer, the second layer comprising Al; and
   depositing a third layer on the second layer, the third layer comprising NiCr.

9. A method according to claim 8, comprising depositing at least the first and second layers by vacuum evaporation.

10. A method according to claim 9, wherein the third layer is also deposited by vacuum evaporation.

11. A method according to claim 8, wherein the second and third layers are substantially free of low workfunction material.

* * * * *